United States Patent
Bohl et al.

(10) Patent No.: US 6,873,190 B2
(45) Date of Patent: Mar. 29, 2005

(54) APPARATUS FOR SENSING THE PRESENCE OF AN INDUCTIVE LOAD DRIVEN BY A PULSE WIDTH MODULATED SIGNAL

(75) Inventors: Robert H. Bohl, Fort Collins, CO (US); Duane L. Harmon, Loveland, CO (US); Kelly J. Reasoner, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/392,062

(22) Filed: Mar. 18, 2003

(65) Prior Publication Data

US 2004/0183572 A1 Sep. 23, 2004

(51) Int. Cl.$^7$ .................................................. H03K 3/00
(52) U.S. Cl. ........................ 327/110; 327/18; 327/20; 324/207.13; 324/207.22
(58) Field of Search ........................... 327/18, 20, 110; 324/207.13, 207.15–207.19, 207.22; 361/152, 153, 160, 170–172, 180, 181

(56) References Cited

U.S. PATENT DOCUMENTS

| | | | | |
|---|---|---|---|---|
| 4,661,766 A | * | 4/1987 | Hoffman et al. ............. | 323/287 |
| 4,845,420 A | * | 7/1989 | Oshizawa et al. ........... | 323/222 |
| 4,953,056 A | * | 8/1990 | Yakuwa et al. .............. | 361/154 |
| 4,970,622 A | * | 11/1990 | Buchl .......................... | 361/154 |
| 5,347,419 A | * | 9/1994 | Caron et al. ................. | 361/154 |
| 5,461,563 A | * | 10/1995 | Mimura ....................... | 701/62 |
| 5,490,031 A | * | 2/1996 | Braun et al. ................ | 361/93.1 |
| 5,541,806 A | * | 7/1996 | Hoffman ..................... | 361/160 |
| 5,621,603 A | * | 4/1997 | Adamec et al. ............. | 361/154 |
| 5,703,750 A | * | 12/1997 | Kim et al. ................... | 361/187 |
| 5,784,245 A | * | 7/1998 | Moraghan et al. .......... | 361/154 |
| 5,975,057 A | * | 11/1999 | Repplinger et al. ......... | 123/490 |
| 6,249,419 B1 | * | 6/2001 | Casellato ..................... | 361/160 |

* cited by examiner

*Primary Examiner*—Kenneth B. Wells

(57) ABSTRACT

A circuit for sensing the presence of an inductive load that is particularly applicable to sensing when a solenoid is being driven by a pulse width modulation (PWM) signal. The circuit includes a high side connected transistor having an output driving a load, with the transistor driven by a PWM signal. A circulating diode is coupled to the driving output of the transistor. The circuit further comprises an operational amplifier (op amp) circuit that is coupled to the circulating diode and operates as an inverting operational amplifier (op amp). The op amp circuit charges a first capacitor when the transistor releases driving an inductive load.

21 Claims, 5 Drawing Sheets

APPARATUS FOR SENSING THE PRESENCE OF AN INDUCTIVE LOAD DRIVEN BY A PULSE WIDTH MODULATED SIGNAL

BACKGROUND OF THE INVENTION

1. Field of the Invention

This invention relates to a sensing apparatus and more particularly to an apparatus for sensing the presence of an inductive load driven by a pulse width modulated (PWM) signal.

2. Description of the Related Art

Media storage systems are well known in the art and are commonly used to store data cartridges at known locations and to retrieve desired data cartridges so that data may be written to or read from the data cartridges. Such media storage systems are often referred to as an autochanger media storage system or, simply, autochanger ("media storage system").

A typical media storage system can include a slot for holding a single data cartridge, or cartridge storage racks or "magazines" that hold several data cartridges. Another type of data cartridge holding device is a cartridge read/write device for reading data from or writing data to the data cartridges within the media storage system. The cartridge storage racks can be accessed by a system operator by opening drawers in the front of the media storage system housing to reveal the cartridge storage racks.

A typical media storage system is also provided with a cartridge handling system for transporting the data cartridges between the cartridge racks and the cartridge read/write device. A typical cartridge handling system includes a cartridge engaging assembly or "picker" for engaging the data cartridges and a positioning device for moving the cartridge engaging assembly between the racks and the read/write device.

Media storage systems of the type described above are usually connected to a host computer system, which can access or store data on the data cartridges. A control system associated with the autochanger actuates the positioning system to move the picker along the cartridge storage locations until the picker is positioned adjacent the desired data cartridge. The picker can then remove the data cartridge from the cartridge rack and carry it to the cartridge read/write device. Once properly positioned adjacent the cartridge read/write device, the picker can insert the selected data cartridge into the cartridge read/write device so that the host computer can read data from or write data to the data cartridge. After the read/write operation is complete, the picker can remove the data cartridge from the cartridge read/write device and return it to the appropriate cartridge rack.

One concern with the type of media storage system is that after a drawer is opened by the operator to access the data cartridges, it can be left fully or partially open or not properly closed. If the picker attempts to remove a data cartridge from a rack in an open or improperly closed drawer, the picker can be damaged. To help prevent this damage, the media storage system is equipped with a solenoid adjacent to each of its drawers to lock the drawers in the closed position prior to operation of the picker. Each drawer has a funnel receiver arranged adjacent to its solenoid so that when the solenoid is activated the plunger engages the funnel receiver to lock the drawer in the closed position. When the solenoid is deactivated it disengages the funnel receiver and the drawer is free to open.

One disadvantage of this type of system is that one or more of the solenoids can be disconnected from its power connection during assembly of the media storage system or through use. If the solenoid is not connected to its power connection it will not lock its drawer. One way to test for this disconnect condition is for the operator to manually pull each one of the drawers to be sure they are locked after the solenoid activate signal is given. This method of testing is inconvenient and time-consuming. Another way to verify that the solenoids are present and connected properly is to provide an apparatus that applies an AC waveform to drive the solenoid and then monitors the resulting waveform. While effective, this approach is complex and expensive.

SUMMARY OF THE INVENTION

In accordance with one embodiment of the invention, a circuit for sensing the presence of an inductive load comprises a high side connected transistor having an output driving a load, the transistor driven by a pulse width modulated (PWM) signal. A circulating diode is coupled to the driving output of the transistor. An operational amplifier (op amp) circuit is coupled to the circulating diode operates as an inverting amplifier. It charges a first capacitor when the transistor is driving a load.

In accordance with another embodiment, a system for verifying that a signal is driving an inductive load comprises a solenoid that is driven by a transistor. The transistor is driven by a pulse width modulation (PWM) signal. The system further comprises a first capacitor and an op amp circuit, with the op amp circuit charging a first capacitor when the transistor is driving the solenoid.

These and other further features and advantages of the invention will be apparent to those skilled in the art from the following detailed description, taken together with the accompanying drawings, in which:

DETAILED DESCRIPTION OF THE INVENTION

Figure 1:
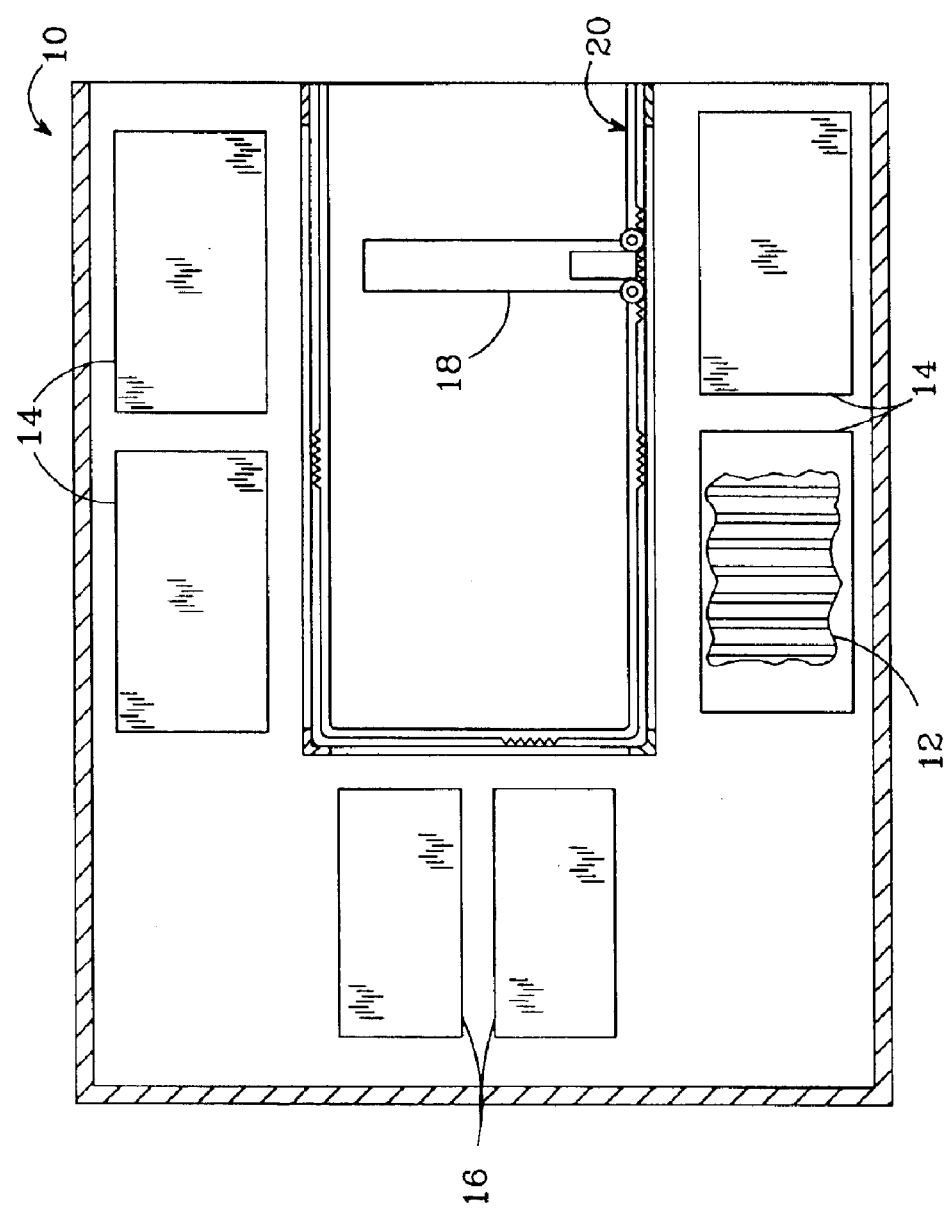
FIG. 1 is a plan view of a media storage system that utilizes an embodiment of a sensing apparatus according to the present invention.
Figure 2:
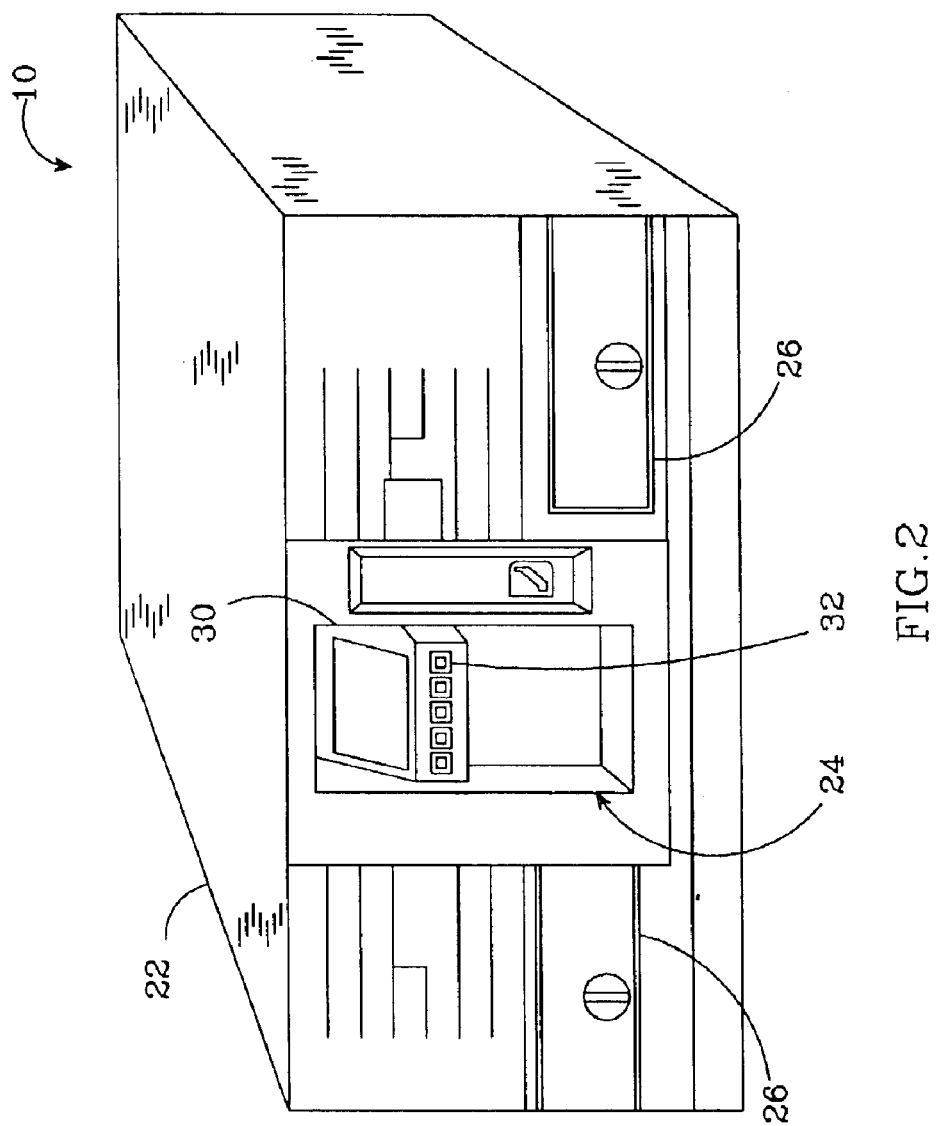
FIG. 2 is a perspective view of the media storage in FIG. 1.

FIGS. 1 and 2 show a media storage system 10 that utilizes an embodiment of a sensing circuit according to the present invention. The media storage system 10 includes data cartridges 12 that can be arranged in different locations including at least one data cartridge storage rack(s) 14, a read/write device 16, and/or a mail slot (not shown). A control system (not shown) associated with the media storage system 10 moves a cartridge "picker" 18 along a positioning rail 20 that is adjacent to storage racks 14 and read/write device 16.

In operation, a host computer (not shown) is linked to the media storage system 10 (direct connection, remote connection, network connection, etc.) and the host computer can issue a request to access a data cartridge 12 stored in one of the storage racks 14 to read and/or write data. In response, the control system moves the picker 18 along the positioning rail 20 and positions the picker 18 adjacent the requested data cartridge 12. Once positioned, the control system signals the picker 18 to withdraw the data cartridge 12 from the storage rack 14 and carry it to the read/write device 16. The linked computer can then read and/or write computer readable data to the cartridge 12.

FIG. 2 is a perspective view of a media storage system 10, which includes a case or housing 22. The housing 22 is included primarily to protect the internal components of the system 12 from dust and/or other foreign objects, but is also included for aesthetic and safety reasons. In a preferred embodiment, the housing 22 includes an interface panel 24 and two drawers 26. The drawers 26 slide within the housing 22 and allow access to the cartridge storage racks 14 shown in FIG. 1. The interface panel 24 includes a display unit 30 and a keypad 32. The display unit 30 can be provided for menu-driven information retrieval, diagnostics, etc.

Figure 3:
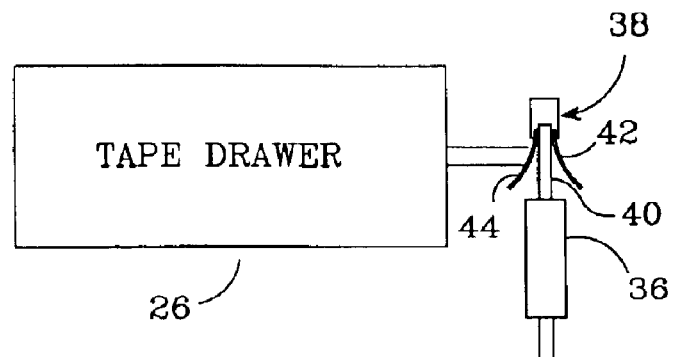
FIG. 3 is a diagram of a media storage system drawer utilizing an embodiment of a sensing apparatus according to the present invention.

FIG. 3 shows one of the media storage system drawers 26 that can be locked in a closed position using a solenoid 36 to avoid damage to the picker during picker operation.

The drawer 26 has a funnel receiver 38 aligned so that the solenoid plunger 40 is aligned with the opening 42 in the receiver 38. When the solenoid is activated as shown in FIG. 3, the solenoid plunger 40 is extended into the funnel opening 42 to lock the drawer 26 in the closed position. The funnel shape of the receiver 38 helps to lock the drawer 26 in the closed position even if the drawer is not completely closed or fully aligned. When the plunger 40 closes, it strikes the angled funnel wall 44 and draws the drawer 26 to the appropriate closed position by the action of the extending plunger 40 against the funnel wall 44. If the solenoid 36 is not connected properly, the plunger 40 would not engage the funnel receiver 38 to lock the drawer. The drawer 26 could then be left improperly closed or could be opened during picker operation, both of which could result in damage to the picker 18 (shown in FIG. 1).

Figure 4:
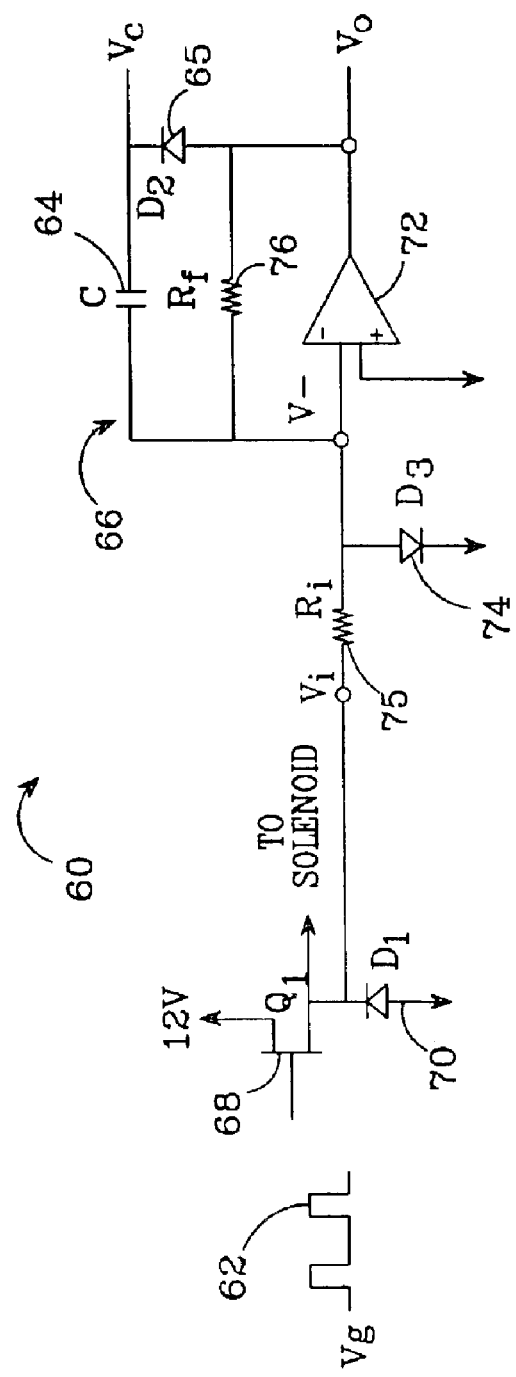
FIG. 4 is a diagram of an embodiment of a sensing apparatus according to the present invention.

FIG. 4 shows a circuit 60 according to the present invention for sensing whether an inductive load is being driven by a PWM signal. The circuit can be used in many applications, with the circuit shown being particularly applicable to testing whether a drawer solenoid 36 (shown in FIG. 3) is being driven by a PWM signal.

When initially driving the solenoid 36, a direct current (DC) signal is applied to give maximum initial throwing force to extend the solenoid plunger. However, a continuous DC signal applied to the solenoid after the initial signal can cause the solenoid to overheat and a DC signal is not needed to keep the plunger in its extended position. Instead, the plunger can be kept extended with a periodic signal after the initial DC signal is applied to the solenoid. A PWM signal (Vg) 62 is the typical periodic signal applied, and in the circuit 60, the signal 62 drives a solenoid though a FET 68. The signal 62 can be generated under microprocessor control and can be an operational or test signal. Many different signal frequencies and duty cycles can be used, with a suitable signal 62 having a 30 KHz frequency and a 33 percent (%) duty cycle.

The circuit 60 generally uses the PWM signal 62 to charge capacitor 64 through an operational amplifier ("op amp") op amp circuit 66, with the charge on the capacitor 64 reflecting whether the solenoid is present and is being driven by PWM signal 62. The circuit elements are arranged so that the first capacitor 64 remains charged as long as the solenoid is being properly driven. The charged capacitor provides voltage Vc, which can be read by a processor as the pass/fail condition for the solenoid connection.

The op amp circuit 66 acts as an inverting amplifier with a charge storage/integrate feature in the first capacitor 64. The first capacitor 64 is connected in series with a second diode 65, with one of the capacitor's two connection points coupled to the cathode of the second diode 65. The other of the capacitor's two connection points is coupled to the negative input of an op amp 72 and the anode of the second diode is coupled to the output of the op amp 72. V− is the signal at the negative input of the op amp 72 and the op amp's positive input is coupled to ground. As more fully described below, when Vi is a negative voltage, V− is either a negative or zero voltage. With a negative or zero voltage from V− at the op amp's negative input, the output of the op amp will increase positively charging capacitor 64 through the forward biased diode. Capacitor charging only occurs during the highs of the PWM signal 62. One high from a cycle may not be enough to fully charge the first capacitor 64 and it can take several signal cycles to initially fully charge the first capacitor 64. Vc represents the voltage charge stored in capacitor.

FIGS. 5 through 9 show various waveforms at different points in the circuit 60 and are discussed in combination with the circuit 60 to describe its operation. The waveforms show the operation of the circuit 60 after the capacitor 64 has been fully charged and the circuit 60 is in its "steady state" condition.

Figure 5:
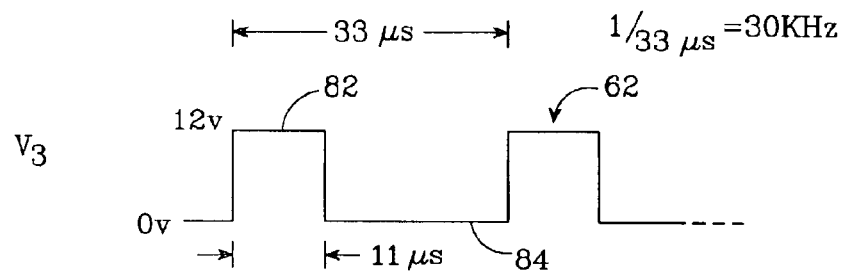
FIG. 5 is a timing diagram of a signal applied to the input of the sensing apparatus in FIG. 4.

FIG. 5 shows the input PWM signal (Vg) 62 in more detail, which is applied to a high side connected field effect transistor (FET) 68 of the circuit 60. The frequency of the PWM signal 62 is 30 kilohertz (kHz) and with a 33% duty cycle PWM signal as shown, the high 82 of each cycle lasts 11 microseconds ($\mu$s) and the low 84 of each cycle lasts 22 $\mu$s. The high 82 of each cycle is 12 volts and the low 84 is 0 volts.

Figure 6:
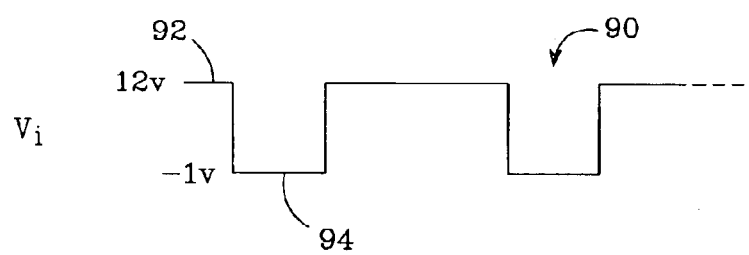
FIG. 6 is a timing diagram of a signal at a point in the sensing apparatus of FIG. 4.

FIG. 6 shows the waveform 90 at point Vi in the circuit 60. During the low 84 of the PWM signal 62 in FIG. 5, the PET 68 is on, which causes Vi to have a corresponding high 92 of approximately 12 volts. The first diode 70 acts as circulating diode for the PET 68, and during the high 82 of the PWM signal 62, the PET 68 is off and effectively forward biased. The solenoid (inductive load) coupled to the FET 68 cannot change its current instantaneously and the solenoid pulls current through the diode 70, which causes the diode 70 to be forward biased. This causes the cathode of the diode 70 to be clamped to its forward voltage of approximately −1.0 volts, which in turn causes Vi to be clamped to approximately −1.0 volts, shown in FIG. 6 as a low of signal 94.

A third diode 74 and its current limiting first resistor 75 are coupled to the negative input of the op amp 72, with the third diode 74 also coupled to ground. This arrangement limits the positive voltage at the negative input of the op amp 72.

Figure 7:
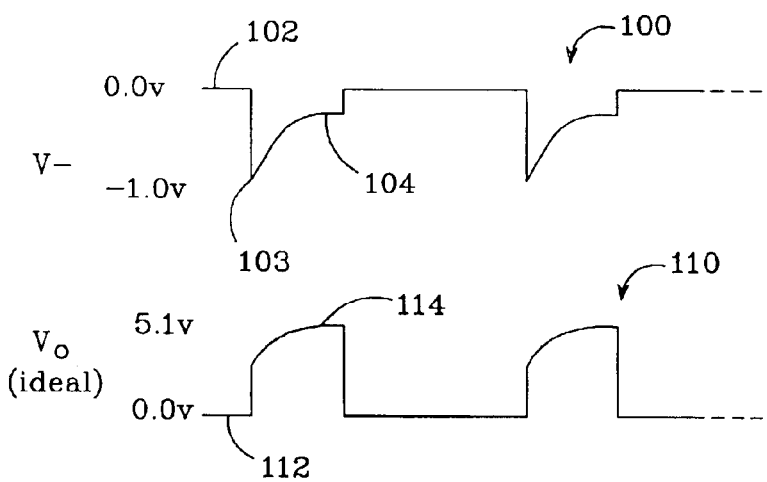
FIG. 7 is a timing diagram of a signal at a second point in the sensing apparatus of FIG. 4.

FIG. 7 shows the signal 100 at node V−, which is at the negative input of the op amp 72. During the high 92 of the Vi signal 90 (in FIG. 6) the op amp 72 is saturated at 0.0 volts and the third diode 74 limits the voltage at V− to a maximum of 0.4 volts. This protects the op amp from destructively high input voltage. When the Vi signal 90 changes to its low 94, the op amp 72 cannot immediately move from saturation at 0 volts to operating in its linear mode. This results in a −1.0 volts spike 103 in the low 104 of V− signal 100. As the op amp 72 moves out of saturation the V– low 103 ramps up to the low 104 of 0 volts, at which point the op amp 72 is in its linear mode.

Figure 8:
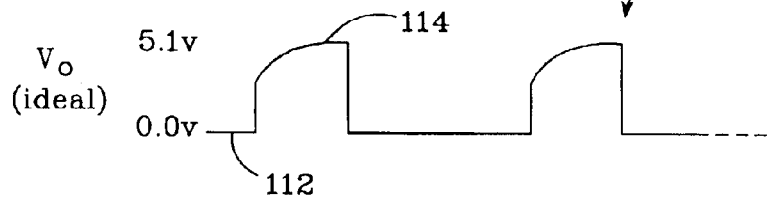
FIG. 8 is a timing diagram of a signal at a third point in the sensing apparatus of FIG. 4.

FIG. 8 shows the waveform 110 of the signal at Vo, which is the output of the op amp 72. When V– high 102 (0.4 volts) is at the op amp's negative input, the op amp 72 goes to low saturation of Vo at ground 112. With 0.4 volts at V– and ground at Vo, the second diode 65 is reverse-biased such that the charge in the capacitor 64 is blocked from leaking. The charge accumulated in capacitor 64 during the highs of the PWM signal 62 remains in the capacitor 64 during the lows of Vo. Accordingly, after the capacitor 64 is fully charged, a generally high voltage Vc can be read by a processor to determine if the solenoid is properly connected.

When V– is at 0.0 volts the op amp 72 is in its linear mode. In the circuit 60, the supply voltage for op amp 72 is preferably 5.1 volts so that when the op amp 72 is in its linear mode, its output is between 0.0 and 5.1 volts, regulating the attempt to maintain V– equal to the positive input (0.0 volts) of the op amp. However, as mentioned above, the op amp cannot come out of saturation instantaneously, and just as the V– signal 100 ramps up to a low 104 of 0 volts, the Vo signal 110 ramps up to its high 114 of 5.1 volts. During Vo high 114 and V– low 104, the second diode 65 is forward biased and current flows into the capacitor 64 to charge it if it is not already fully charged.

Figure 9:
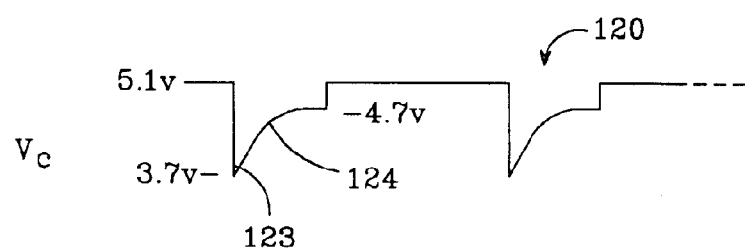
FIG. 9 is a timing diagram of the output of the sensing apparatus of claim 4.

FIG. 9 shows the waveform for the signal 120 at Vc after the capacitor 64 has been fully charged: Vc is not a DC high but varies between 3.7 and 5.1 volts, although this range of voltages can be read as a high signal. This fluctuation is the result of V– and Vc being capacitively coupled, so that changes at V– are reflected at Vc. For example, when V– changes from its V– high 102 to its V– low 104 it first experiences a spike 103. This is reflected in the Vc signal 120 at spike 123, which has the same magnitude as V– spike 103. As the V– signal 100 ramps up to its low 104, the Vc signal 120 also ramps up to its low 124 (4.7 volts). When the V– signal goes back to its V– high 102 (0.4 volts), the Vc signal returns to its high 102 (5.1 volts). The high 102 is approximately equal to the high 114 of Vo as shown in FIG. 8. This assumes an approximately ideal second diode 65. If the second diode 65 is less than ideal, an voltage drop across the second diode 65 will be reflected in the high 102 of Vc. For example, if the voltage drop across the second diode 65 is 0.4 volts, the high 102 of Vc will be 4.7 volts. To obtain a more constant Vc signal 120, a resistor-capacitor circuit can be included as more fully described below.

Many different components can be used in the circuit 60 as shown in FIG. 4, and the components can be arranged in different ways according to the invention. A preferred first capacitor 64 is 0.1 μF capacitor, a preferred first resistor 75 is 1.2 Kohm resistor, and the second and third diodes 65, 74 are commercially available Schottky diodes. Many different amplifiers can be used for op amp 72 such as, without limitation, AD8054 and AD822, both available from Analog Devices, Inc.

A second resistor 76 can be included in those embodiments where it is desirable to prevent the op amp 72 from saturating at its positive rail. The voltage provided at the output Vo is then set by the first resistor 75 divided by the second resistor 76.

Circuits according to the present invention are adapted to sensing many different failures related to driving inductive loads like a solenoid. Some of the failures include the solenoid power being disconnected, the FET failing, the PWM signal drive failing, and the solenoid failing either open or shorted. During these failures the FET 68 is still operating but the low at Vi is 0 volts instead of approximately –1.0 volts. V– is 0 volts when Vi is 0 volts so no current is flowing through the first resistor 75. As a result, zero current flows through the capacitor 64 and the second resistor 76 and Vo remains at 0 volts. At this state the capacitor 64 is not charging and it is allowed to dissipate. When the capacitor bleeds off from 5.1 volts to 0 volts, the output Vc will be 0 volts, which indicates that the solenoid lost its power connection.

Figure 10:
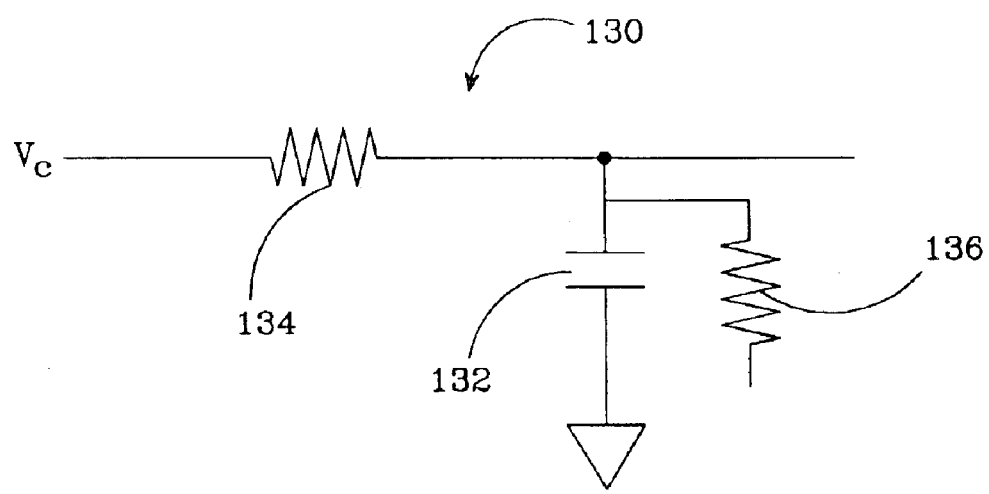
FIG. 10 is diagram of an embodiment of a resistor-capacitor (RC) filtering circuit according to the present invention.

FIG. 10 shows a RC circuit 130 that can be coupled to the output Vc of the circuit 60. The circuit 130 further filters the output Vc to provide a more ideal constant voltage output. The circuit 130 includes a second capacitor 132 and a third resistor 134, with the resistor 134 coupled between Vc and the capacitor 132, and the capacitor 132 also coupled to ground. Many different capacitors and resistors can be used, with a preferred second capacitor 132 being a 0.1 μF capacitor and a preferred second resistor 134 being a 4.7 Kohm resistor.

The circuit 130 can also include a fourth resistor 136 that allows for capacitor 64 to discharge when the solenoid is disconnected. Without resistor 136, the first capacitor 64 will essentially be prevented from discharging by the second diode 65. The resistor 136 provides a quicker means for discharging the first capacitor 64 so that the circuit 60 can detect intermittent disconnects of the solenoid's power connection. The fourth resistor 136 can have many different values with a suitable resistor 136 being a 47 Kohm resistor.

The present invention provides a simple and inexpensive way for sensing whether a load is being driven by its PWM drive signal. One particular embodiment is particularly applicable to verifying that a solenoid is properly connected to its power connection by sensing whether a solenoid is being driven by its PWM drive signal.

Although the present invention has been described in considerable detail with reference to certain preferred configurations thereof, other versions are possible. Many different circuit components can be used and can be arranged in many different ways. The circuit according to the present invention can be used as a sensor for many different types of PWM driven inductive loads.

We claim:

1. A circuit for sensing the presence of an inductive load, comprising:
   a high side connected transistor having an output driving an inductive load, said transistor driven by a pulse width modulated (PWM) signal;
   a circulating diode coupled directly between said driving output of said transistor and ground; and
   an operational amplifier (op amp) circuit coupled to a cathode of said circulating diode, said op amp circuit operating as an inverting amplifier and charging a first capacitor when said transistor is driving said inductive load, said first capacitor when charged serving as an indicator when said transistor is driving said inductive load, and said circulating diode being forward biased during a high of said PWM signal and clamping the voltage to said op amp circuit.

2. The circuit of claim 1, wherein said op amp circuit charges said first capacitor during the high of each PWM signal cycle and prevents discharge of said first capacitor during the low of each PWM signal cycle.

3. The circuit of claim 1, wherein said operation amplifier circuit comprises an amplifier that draws current through said first capacitor during the high of each cycle of said PWM signal, charging said first capacitor.

4. The circuit of claim 3, further comprising a second diode coupled to said first capacitor, said second diode being reverse-biased by said amplifier during the low of cycle of said PWM signal to block the discharge of said first capacitor.

5. The circuit of claim 1, further comprising resistor-capacitor (RC) circuit having a second resistor and second capacitor, said circuit coupled to said first capacitor as a filter.

6. The circuit of claim 5, further comprising a third resistor that permits said first capacitor to discharge to ground when said transistor is not driving said inductive load.

7. The circuit of claim 1, wherein said inductive load is a solenoid.

8. The circuit of claim 1, wherein the charge on said capacitor is measured by a processor to verify if said transistor is driving said inductive load.

9. A circuit for sensing the presence of an inductive load, comprising:
- a high side connected transistor having an output driving an inductive load, said transistor driven by a pulse width modulated (PWM) signal;
- a circulating diode coupled to said driving output of said transistor; and
- an operational amplifier (op amp) circuit coupled to said circulating diode, said op amp circuit operating as an inverting amplifier and charging a first capacitor when said transistor is driving said inductive load, wherein said operational amplifier circuit comprises an amplifier with ground at its positive input and a negative voltage at its negative input during the high of each said PWM signal cycle.

10. A circuit for sensing the presence of an inductive load, comprising:
- a high side connected transistor having an output driving an inductive load, said transistor driven by a pulse width modulated (PWM) signal;
- a circulating diode coupled to said driving output of said transistor; and
- an operational amplifier (op amp) circuit coupled to said circulating diode, said op amp circuit operating as an inverting amplifier and charging a first capacitor when said transistor is driving said inductive load, wherein said operation amplifier circuit comprises an amplifier and a second diode, said amplifier having ground at its positive input and a positive voltage at its negative input during the low of each cycle of said PWM signal, said second diode coupled between the output of said amplifier and having a reverse bias preventing the discharge of said first capacitor.

11. A circuit for sensing the presence of an inductive load, comprising:
- a high side connected transistor having an output driving an inductive load, said transistor driven by a pulse width modulated (PWM) signal;
- a circulating diode coupled to said driving output of amplifier that draws current through said first capacitor during the high of each cycle of said PWM signal, charging said first capacitor, wherein said operation amplifier circuit comprises an amplifier and a diode, said amplifier having ground at its positive input and a positive voltage at its negative input during the low of each cycle of said PWM signal, said second diode coupled between the output of said amplifier and having a reverse bias preventing the discharge of said first capacitor.

12. The circuit of claim 11, wherein said first resistor and said third diode are arranged to limit the positive voltage at said negative input of said amplifier.

13. A system for verifying that a signal is driving an inductive load, comprising:
- a transistor driving a solenoid, said transistor driven by a pulse width modulation (PWM) signal;
- an operational amplifier (op amp) circuit coupled to said transistor and charging a first capacitor when said transistor is driving said solenoid, said capacitor when charged serving as an indicator that said transistor is driving said solenoid; and
- a circulating diode clamping the voltage at the input to said op amp circuit during a high of said PWM signal.

14. The system of claim 13, wherein said op amp circuit charges said first capacitor during the high of each PWM signal cycle and prevents discharge of said first capacitor during the low of each PWM signal cycle.

15. The system of claim 13, wherein said operation amplifier circuit comprises an amplifier that draws current through said first capacitor during the high of each cycle of said PWM signal, charging said first capacitor.

16. The system of claim 15, further comprising a diode coupled to said capacitor, said diode reverse-biased by said amplifier during the low of each cycle of said PWM signal to block the discharge of said first capacitor.

17. The system of claim 15, wherein said operational amplifier circuit comprises a first resistor and diode coupled to the negative input of said amplifier to limit the positive voltage at said negative input.

18. The system of claim 15, further comprising a resistor-capacitor network coupled to said first capacitor and having a second resistor and second capacitor coupled together as a filter.

19. The system of claim 13, wherein the load comprises a solenoid.

20. A system for verifying that a signal is driving an inductive load, comprising:
- a transistor driving a solenoid, said transistor driven by a pulse width modulation (PWM) signal; and
- an operational amplifier (op amp) circuit charging a first capacitor when said transistor is not driving said solenoid, wherein said operation amplifier circuit comprises an amplifier that draws current through said first capacitor during the high of each cycle of said PWM signal, charging said first capacitor, wherein said operational amplifier circuit comprises an amplifier with ground at its positive input and a negative voltage at its negative input during the high of each said PWM signal cycle.

21. A system for verifying that a signal is driving an inductive load, comprising:
- a transistor driving a solenoid, said transistor driven by a pulse width modulation (PWM) signal; and
- an operational amplifier (op amp) circuit charging a first capacitor when said transistor is not driving said solenoid, wherein said operation amplifier circuit comprises an said transistor; and
- an operational amplifier (op amp) circuit coupled to said circulating diode, said op amp circuit operating as an inverting amplifier and charging a first capacitor when said transistor is driving said inductive load, wherein said amplifier circuit comprises an amplifier having a first resistor and third diode coupled to its negative input, said amplifier's positive input coupled to ground, said first capacitor coupled across the negative input and positive output of said op amp, said circuit. further comprising a second diode disposed between the output of said op amp and said first capacitor.

* * * * *

UNITED STATES PATENT AND TRADEMARK OFFICE
CERTIFICATE OF CORRECTION

| | | |
|---|---|---|
| PATENT NO. | : 6,873,190 B2 | Page 1 of 2 |
| APPLICATION NO. | : 10/392062 | |
| DATED | : March 29, 2005 | |
| INVENTOR(S) | : Robert H. Bohl et al. | |

It is certified that error appears in the above-identified patent and that said Letters Patent is hereby corrected as shown below:

In column 4, line 42, delete "PET" and insert -- FET --, therefor.

In column 4, line 44, delete "PET" and insert -- FET --, therefor.

In column 4, line 45, delete "PET" and insert -- FET --, therefor.

In column 7, lines 50-59, in Claim 11, delete "amplifier that draws current through said first capacitor during the high of each cycle of said PWM signal, charging said first capacitor, wherein said operation amplifier circuit comprises an amplifier and a diode, said amplifier having ground at its positive input and a positive voltage at its negative input during the low of each cycle of said PWM signal, said second diode coupled between the output of said amplifier and having a reverse bias preventing the discharge of said first capacitor." and insert -- said transistor; and an operational amplifier (op amp) circuit coupled to said circulating diode, said op amp circuit operating as an inverting amplifier and charging a first capacitor when said transistor is driving said inductive load, wherein said amplifier circuit comprises an amplifier having a first resistor and third diode coupled to its negative input, said amplifier's positive input coupled to ground, said first capacitor coupled across the negative input and positive output of said op amp, said circuit further comprising a second diode disposed between the output of said op amp and said first capacitor. --, therefor.

In column 8, line 40, in Claim 20, delete "capacitor," and insert -- capacitor and, --, therefor.

UNITED STATES PATENT AND TRADEMARK OFFICE
CERTIFICATE OF CORRECTION

PATENT NO. : 6,873,190 B2
APPLICATION NO. : 10/392062
DATED : March 29, 2005
INVENTOR(S) : Robert H. Bohl et al.

It is certified that error appears in the above-identified patent and that said Letters Patent is hereby corrected as shown below:

In column 8, lines 53-64, in Claim 21, delete "said transistor; and an operational amplifier (op amp) circuit coupled to said circulating diode, said op amp circuit operating as an inverting amplifier and charging a first capacitor when said transistor is driving said inductive load, wherein said amplifier circuit comprises an amplifier having a first resistor and third diode coupled to its negative input, said amplifier's positive input coupled to ground, said first capacitor coupled across the negative input and positive output of said op amp, said circuit. further comprising a second diode disposed between the output of said op amp and said first capacitor." and insert -- amplifier that draws current through said first capacitor during the high of each cycle of said PWM signal, charging said first capacitor, wherein said operation amplifier circuit comprises an amplifier and a diode, said amplifier having ground at its positive input and a positive voltage at its negative input during the low of each cycle of said PWM signal, said second diode coupled between the output of said amplifier and having a reverse bias preventing the discharge of said first capacitor. --, therefor.

Signed and Sealed this

Eleventh Day of August, 2009

David J. Kappos
*Director of the United States Patent and Trademark Office*